(12) United States Patent
Inada et al.

(10) Patent No.: US 9,944,312 B2
(45) Date of Patent: Apr. 17, 2018

(54) ELECTRONIC CONTROL UNIT, ELECTRIC POWER STEERING DEVICE, AND VEHICLE

(71) Applicant: NSK Ltd., Shinagawa-ku, Tokyo (JP)

(72) Inventors: Yoshikatsu Inada, Fujisawa (JP); Kotaro Tagami, Fujisawa (JP); Takaaki Sekine, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 15/103,496

(22) PCT Filed: Dec. 12, 2014

(86) PCT No.: PCT/JP2014/006201
§ 371 (c)(1),
(2) Date: Jun. 10, 2016

(87) PCT Pub. No.: WO2015/087555
PCT Pub. Date: Jun. 18, 2015

(65) Prior Publication Data
US 2016/0311462 A1    Oct. 27, 2016

(30) Foreign Application Priority Data

Dec. 13, 2013  (JP) .................. 2013-258298
Dec. 13, 2013  (JP) .................. 2013-258299
(Continued)

(51) Int. Cl.
*B62D 5/04*    (2006.01)
*H02K 11/33*   (2016.01)
(Continued)

(52) U.S. Cl.
CPC ......... *B62D 5/0406* (2013.01); *B62D 5/0457* (2013.01); *B62D 5/0463* (2013.01);
(Continued)

(58) Field of Classification Search
None
See application file for complete search history.

(56) References Cited

U.S. PATENT DOCUMENTS

| 5,810,111 A | 9/1998 | Takeuchi et al. |
| 7,021,418 B2 | 4/2006 | Tominaga et al. |

(Continued)

FOREIGN PATENT DOCUMENTS

| CN | 1956639 A | 5/2007 |
| CN | 101920721 A | 12/2010 |

(Continued)

OTHER PUBLICATIONS

U.S. Office Action issued in copending U.S. Appl. No. 15/103,035 dated Jun. 6, 2017 (Seven (7) pages).
(Continued)

*Primary Examiner* — Xanthia C Cunningham
(74) *Attorney, Agent, or Firm* — Crowell & Moring LLP

(57) ABSTRACT

An electronic control unit (50) includes power modules (60A), (60B), an input and output board (70) on which an input connector (71) and an output connector (72) are mounted, and a control board (80). The input and output board (70) and the control board (80) are arranged to vertically face each other. A discrete part (73) that is taller in height (H1), (H2), (H3) than a half (D/2) a distance (D) between the input and output board (70) and the control board (80) is mounted only on a face (70e), of the input and output board (70), facing the control board (80).

11 Claims, 18 Drawing Sheets

(30) Foreign Application Priority Data

| Dec. 13, 2013 | (JP) | 2013-258300 |
|---|---|---|
| Dec. 13, 2013 | (JP) | 2013-258301 |
| Dec. 20, 2013 | (JP) | 2013-263957 |
| Dec. 20, 2013 | (JP) | 2013-263958 |
| Dec. 20, 2013 | (JP) | 2013-263959 |
| Dec. 20, 2013 | (JP) | 2013-263960 |

(51) Int. Cl.
*H02P 27/06* (2006.01)
*H05K 7/14* (2006.01)
*H05K 7/20* (2006.01)

(52) U.S. Cl.
CPC ............ *H02K 11/33* (2016.01); *H02P 27/06* (2013.01); *H05K 7/1432* (2013.01); *H05K 7/20854* (2013.01)

(56) References Cited

U.S. PATENT DOCUMENTS

| 7,312,545 | B2 | 12/2007 | Sasaki et al. |
| 7,357,216 | B2 | 4/2008 | Ishii et al. |
| 7,488,184 | B2 | 2/2009 | Yasuda et al. |
| 7,886,865 | B2 | 2/2011 | Sekine et al. |
| 7,909,130 | B2 | 3/2011 | Morikawa et al. |
| 8,339,801 | B2 | 12/2012 | Tominaga et al. |
| 2002/0118511 | A1 | 8/2002 | Dujari et al. |
| 2006/0006749 | A1 | 1/2006 | Sasaki et al. |
| 2007/0089927 | A1 | 4/2007 | Kim et al. |
| 2007/0152503 | A1* | 7/2007 | Kowalick .......... H01R 13/6397 307/10.1 |
| 2008/0038873 | A1 | 2/2008 | Tanida |
| 2008/0278918 | A1* | 11/2008 | Tominaga ............ B62D 5/0406 361/719 |
| 2009/0120712 | A1* | 5/2009 | Kashimoto .......... B62D 5/0406 180/444 |
| 2009/0295325 | A1* | 12/2009 | Sekine ................. B62D 5/0406 318/646 |
| 2010/0295498 | A1* | 11/2010 | Tominaga ............ B62D 5/0406 318/689 |
| 2011/0018374 | A1 | 1/2011 | Yamasaki et al. |
| 2011/0074323 | A1 | 3/2011 | Mukai |
| 2011/0278995 | A1 | 11/2011 | Akutsu et al. |
| 2012/0014070 | A1 | 1/2012 | Wakita |
| 2012/0104886 | A1 | 5/2012 | Yamasaki et al. |
| 2012/0160596 | A1 | 6/2012 | Yamasaki |
| 2012/0286630 | A1 | 11/2012 | Tomizawa et al. |
| 2013/0003324 | A1 | 1/2013 | Ishikawa |
| 2013/0069493 | A1 | 3/2013 | Ogawa |
| 2013/0119908 | A1 | 5/2013 | Harada et al. |
| 2014/0091683 | A1* | 4/2014 | Ito .......................... H02K 11/38 310/68 R |
| 2014/0265749 | A1* | 9/2014 | Motoda ................. H02K 5/225 310/68 R |
| 2015/0069829 | A1* | 3/2015 | Dulle ...................... B60R 16/03 307/9.1 |
| 2016/0244088 | A1* | 8/2016 | Hagiwara ............ B62D 5/0406 |

FOREIGN PATENT DOCUMENTS

| CN | 102340963 A | 2/2012 |
| CN | 102849102 A | 1/2013 |
| CN | 202935424 U | 5/2013 |
| EP | 1 615 317 A1 | 1/2006 |
| JP | 35-4723 | 3/1960 |
| JP | 7-14951 A | 1/1995 |
| JP | 2002-119068 A | 4/2002 |
| JP | 2002-246537 A | 8/2002 |
| JP | 2004-17884 A | 1/2004 |
| JP | 2004-79776 A | 3/2004 |
| JP | 2004-129362 A | 4/2004 |
| JP | 2007-166793 A | 6/2007 |
| JP | 2007-167793 A | 7/2007 |
| JP | 2008-66696 A | 3/2008 |
| JP | 2008-285142 A | 11/2008 |
| JP | 2010-30489 A | 2/2010 |
| JP | 2010-68670 A | 3/2010 |
| JP | 2010-105639 A | 5/2010 |
| JP | 2011-30405 A | 2/2011 |
| JP | 2011-176999 A | 9/2011 |
| JP | 2011-235811 A | 11/2011 |
| JP | 2012-74440 A | 4/2012 |
| JP | 2012-143036 A | 7/2012 |
| JP | 4998836 B2 | 8/2012 |
| JP | 2012-200070 A | 10/2012 |
| JP | 2012-218701 A | 11/2012 |
| JP | 2012-239293 A | 12/2012 |
| JP | 2013-65695 A | 4/2013 |
| JP | 2013-91474 A | 5/2013 |
| JP | 2013-151205 A | 8/2013 |
| JP | 5373949 B1 | 12/2013 |

OTHER PUBLICATIONS

U.S. Office Action issued in copending U.S. Appl. No. 15/103,116 dated Jun. 2, 2017 (Seven (7) pages).
International Search Report (PCT/ISA/210) issued in PCT Application No. PCT/JP2014/006201 dated Mar. 3, 2015 with English-language translation (four (4) pages).
Japanese-language Written Opinion (PCT/ISA/237) issued in PCT Application No. PCT/JP2014/006201 dated Mar. 3, 2015 (four (4) pages).
Japanese-language Office Action issued in counterpart Japanese Application No. 2013-258300 dated Feb. 23, 2016 with English translation (Six (6) pages).
Japanese-language Office Action issued in counterpart Japanese Application No. 2013-258301 dated Feb. 23, 2016 with English translation (Six (6) pages).
Japanese-language Office Action issued in counterpart Japanese Application No. 2013-263957 dated Mar. 1, 2016 with English translation (Six (6) pages).
Japanese-language Office Action issued in counterpart Japanese Application No. 2013-263958 dated Mar. 1, 2016 with English translation (Five (5) pages).
Japanese-language Office Action issued in counterpart Japanese Application No. 2013-263960 dated Mar. 1, 2016 with English translation (Five (5) pages).
Japanese Office Action issued in Japanese Patent Application No. 2013-263959 dated Jun. 21, 2016 with English translation (seven pages).
International Preliminary Report on Patentability (PCT/IB/338 & PCT/IB/373) issued in PCT Application No. PCT/JP2014/006201 dated Jun. 23, 2016, including English translation of document C2 (Japanese-language Written Opinion (PCT/ISA/237)) previously filed on Jun. 15, 2016 (seven pages).
Extended European Search Report issued in counterpart European Application No. 14869924.2 dated May 11, 2017 (Eight (8) pages).
European Search Report issued in counterpart European Application No. 14870452.1 dated Feb. 17, 2017 (seven pages).
Chinese-language Office Action issued in counterpart Chinese Application No. 201480061987.6 dated Feb. 15, 2017 with English translation (Fourteen (14) pages).
International Search Report (PCT/ISA/210) issued in PCT Application No. PCT/JP2014/006199 dated Mar. 10, 2015 with English translation (Three (3) pages).
International Preliminary Report on Patentability (PCT/IB/373) issued in PCT Application No. PCT/JP2014/006199 dated Jun. 14, 2016 including Japanese-language Written Opinion (PCT/ISA/237) dated Mar. 10, 2015 with English translation (Eight (8) pages).
Chinese-language Office Action issued in counterpart Chinese Application No. 201480061987.6 dated Aug. 30, 2017 with unverified English translation (eight pages).
Extended European Search Report issued in counterpart European Application No. 14869940.8 dated Sep. 15, 2017 (seven pages).

(56) References Cited

OTHER PUBLICATIONS

Chinese-language Office Action issued in counterpart Chinese Application No. 201480067602.7 dated Apr. 26, 2017 with Partial English translation (9 pages).

* cited by examiner

FIG. 2

ELECTRONIC CONTROL UNIT, ELECTRIC POWER STEERING DEVICE, AND VEHICLE

TECHNICAL FIELD

The present invention relates to an electronic control unit (ECU: Electronic Control Unit), an electric power steering, and a vehicle, in particular, to an electronic control unit configured to control driving of an electric motor, an electric power steering device using the same, and a vehicle in which the electric power steering is equipped.

BACKGROUND ART

The electronic control unit in the electric power steering device equipped in a vehicle controls driving of the electric motor, and includes a power board or a power module equipped with switching elements, and a control board on which a control device of controlling an output current from the power module is implemented. The power module is electrically connected with the electric motor via an output connector, and the control board is electrically connected with the battery and the torque sensor of the vehicle.

In this situation, there is a demand for downsizing the ECU and the electric motor to be flexibly applied to arranged positions in a vehicle depending on the type of the vehicle. To address this demand, the electric power steering device in which the electronic control unit and the electric motor are integrated, as disclosed in Patent Literature 1 is conventionally proposed.

The ECU of the electric power steering device of Patent Literature 1 includes a power board on which switching elements are mounted, a control module that controls output currents from the power board, a DC conductor module including a power terminal block to which the power is supplied from the battery, and an AC conductor module including a motor terminal block that supplies the power to the electric motor.

Then, the power board is screwed onto a metal housing, and in addition, the DC conductor module and the AC conductor module are arranged above the power board, and are respectively screwed onto the metal housing. Also, the control module is arranged above the DC conductor module and the AC conductor module, and is screwed onto the metal housing.

Here, discrete parts that are considered to electronic parts short in height, such as switching elements or shunt resistances, and discrete parts that are considered to electronic parts tall in height, such as relays or jumper leads are mounted on the power board. On the other hand, discrete parts that are considered to be electronic parts having large sizes and tall heights such as electrolytic capacitors, relays, and normal filters are mounted on the bottom face of the bus bar of the DC conductor module arranged to face the power board vertically. In order to reduce the height of the ECU, the power board and the DC conductor module are arranged so that the afore-mentioned discrete parts tall in height do not interfere with each other.

CITATION LIST

Patent Literature

PLT 1: JP 2010-30489 A

SUMMARY

Technical Problem

However, the ECU in the conventional electric power steering device of Patent Literature 1 has a following drawback.

That is to say, in order to reduce the height of the ECU, the power module and the DC conductor module vertically facing each other have to be arranged so that the high discrete parts do not interfere with each other. Hence, there are limits in the mounting locations in the power module and the DC conductor module.

Therefore, the present invention has been made to address the above conventional drawback, and has an object to provide an electronic control unit, an electric power steering device having the same, and a vehicle on which the electric power steering device is mounted, in which the height of the electronic control unit can be reduced by devising arrangements of the discrete parts that are considered to be electronic parts tall in height such as electrolytic capacitors and coils, without limiting the mounting arrangements of an input and output board and a control board vertically facing each other.

Solution to Problem

In order to address the above drawback, according to one aspect of the present invention, there is provided an electronic control unit including: a power module on which switching elements are mounted; an input and output board on which an input connector and an output connector are mounted; and a control board on which a controller configured to control output currents from the power module is mounted, wherein the input and output board and the control board are arranged to vertically face each other, and wherein a discrete part that is taller in height than a half a distance between the input and output board and the control board is mounted only on a surface of the input and output board, the surface facing the control board.

In addition, according to further another aspect of the present invention, there is provided an electric power steering device including the above-described electronic control unit.

Further, in the above-described electric power steering device, the electric motor may generate a steering assistance force of assisting the steering operation.

Moreover, according to yet another aspect of the present invention, there is provided a vehicle including the above-described electric power steering device.

Advantageous Effects

According to an electric control unit, an electric power steering device, and a vehicle, discrete parts that are considered to be electronic parts tall in height, in other words, the discrete parts that are higher than a half a distance between the input and output board and the control board are mounted only on the face of the input and output board facing the control board out of the input and output board and the control board arranged to vertically face each other. Hence, the height of the electronic control unit can be reduced without limiting the mounting arrangements of the input and output board and the control board vertically facing each other.

BRIEF DESCRIPTION OF DRAWINGS

FIG. 2 is a block diagram illustrating a control system of the motor controller of the electric power steering device illustrated in FIG. 1;

DESCRIPTION OF EMBODIMENTS

Hereinafter, embodiments of the present invention will be described with reference to the accompanied drawings.

Figure 1:
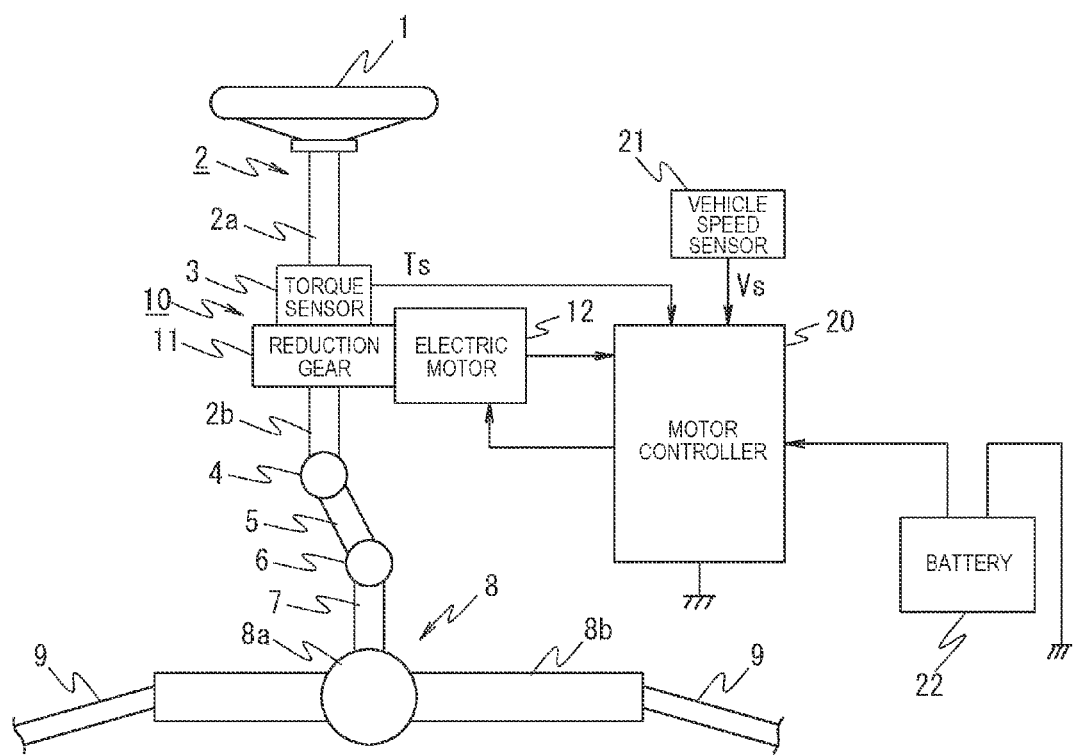
FIG. 1 is a view of a basic configuration of an electric power steering device in which an electronic control unit operating as a motor controller in some embodiments of the present invention.

FIG. 1 is a view of a basic configuration of an electric power steering device in which an electronic control unit operating as a motor controller in some embodiments of the present invention.

The electric power steering device illustrated in FIG. 1 is equipped in a vehicle like an automobile. In such an electric power steering device, a steering force exerted by a driver to a steering wheel 1 is transmitted to a steering shaft 2. The steering shaft 2 includes an input shaft 2a and an output shaft 2b. One end of the input shaft 2a is coupled with the steering wheel 1, whereas the other end thereof is coupled through a steering torque sensor 3 with the outer end of the output shaft 2b.

Then, the steering force that has been transmitted to the output shaft 2b is transmitted via a universal joint 4 to a lower shaft 5, and is further transmitted to a pinion shaft 7 via a universal joint 6. The steering force that has been transmitted to the pinion shaft 7 is transmitted to a tie rod 9 via a steering gear 8, so that turning wheels, not illustrated, are made to turn. Here, the steering gear 8 is configured to be a rack and pinion form including a pinion 8a connected with the pinion shaft 7 and a rack 8b engaging with the pinion 8a, and the rotational motion that has been transmitted to the pinion 8a is converted at the rack 8b into the straight motion in the vehicle widthwise direction.

The output shaft 2b of the steering shaft 2 is coupled with a steering assistance mechanism 10 that transmits a steering assistance force to the output shaft 2b. The steering assistance mechanism 10 includes a reduction gear 11 including, for example, a worm gear mechanism connected with the output shaft 2b, and an electric motor 12 operating as the electric motor including, for example, a three-phase brushless motor producing the steering assistance force and connected with the reduction gear 11.

The steering torque sensor 3 detects steering torque exerted onto the steering wheel 1 and then transmitted to the input shaft 2a. The steering torque sensor 3, for example, converts the steering torque into a twisting angular displacement of a torsion bar (not illustrated) arranged between the input shaft 2a and the output shaft 2b, and to convert the twisting angular displacement into an angle difference between an input-side rotational angle sensor (not illustrated) arranged on the input shaft 2a side and an output side rotational angle sensor (not illustrated) arranged on the output shaft 2b side.

Figure 2:
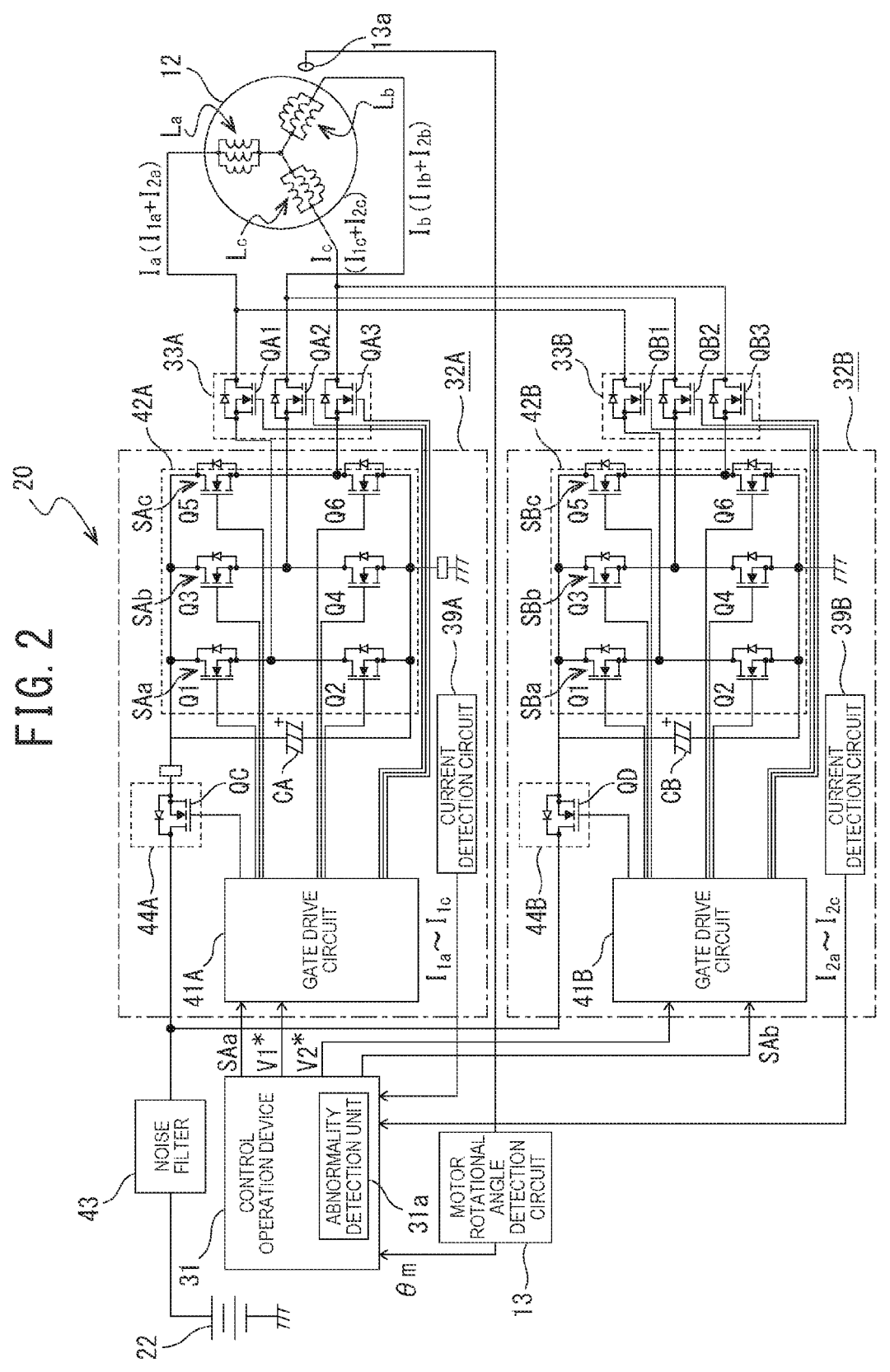

In addition, the electric motor 12 is configured with, for example, a three-phase brushless motor, and as illustrated in FIG. 2, motor windings La, Lb, and, Lc of A phase, B phase, and C phase of the three phases are respectively wound around slots of the stator. One ends of the motor windings La, Lb, and Lc are connected together to form a star connection, whereas the other ends of the motor windings La, Lb, and Lc are connected with a motor controller 20, so that motor drive currents Ia, Ib, and Ic are individually supplied.

The electric motor 12, as illustrated in FIG. 2, includes a rotational position sensor 13a configured to detect the rotational position of the motor. The detection value from the rotational position sensor 13a is supplied to a motor rotational angle detection circuit 13, so that the motor rotational angle detection circuit 13 detects a motor rotational angle θm.

In addition, a direct current is input into the motor controller 20 from a battery 22 operating as a direct current power source.

Herein, as illustrated in FIG. 2, the motor controller 20 includes a control operation device 31 configured to operate three-phase voltage instruction values V1* and V2*, first and second motor drive circuits 32A and 32B into which the three-phase motor voltage instruction values V1* and V2* output from the control operation device 31 are individually input, and first and second motor current cutoff circuits 33A and 33B respectively arranged between the first and second motor drive circuits 32A and 32B and the motor windings La, Lb, and Lc of the respective phases of the electric motor 12.

The control operation device 31 receives a steering torque detected by the steering torque sensor 3, a vehicle speed detected by a vehicle speed sensor 21, and a motor rotational angle θm output from the motor rotational angle detection circuit 13, a motor angular velocity, and a motor angular acceleration. In addition, the control operation device 31 receives motor drive currents I1a to I1c and I2a to I2c, output from current detection circuits 39A and 39B, and supplied to the motor windings La, Lb, and Lc of the respective phases of the electric motor 12. Then, the control operation device 31 calculates the three-phase voltage instruction values V1* and V2* corresponding to the first and second motor drive circuits 32A and 32B based on the steering torque, the vehicle speed, the motor rotational angle θm, the motor angular velocity, and the motor angular acceleration, and then outputs the calculated three-phase voltage instruction values V1* and V2* to gate drive circuits 41A and 41B, as will be described later, of the first and second motor drive circuits 32A and 32B.

Then, the control operation device 31 includes an abnormality detection unit 31a configured to detect an open failure of the upper arms and a short-circuit failure of the lower arms of field effect transistors (FET) Q1 to Q6 operating as switching elements included in first and second inverter circuits 42A and 42B, as will be described later, and a disconnection abnormality of any of the coil units of the motor windings La, Lb, and Lc of the respective phases of the electric motor 12. When the abnormality detection unit 31a does not detect an open failure or a short-circuit failure of the field effect transistors (FET) Q1 to Q6, the abnormality detection unit 31a outputs failure detection signals SAa and SAb of logical values "0" (normality) to the gate drive circuits 41A and 41B of the first and second motor drive circuits 32A and 32B, whereas when the abnormality detection unit 31a detects the open failure and the short-circuit failure of the field effect transistors (FET) Q1 to Q6, the abnormality detection unit 31a outputs a failure detection signals SAa or SAb of a logical value "1" (abnormality) to the gate drive circuit 41A or 41B of the first and second motor drive circuit 32A or 32B where the abnormality has been detected.

Each of the first and second motor drive circuits 32A and 32B receives the three-phase voltage instruction values V1* and V2* output from the control operation device 31, and forms a gate signal, and includes gate drive circuits 41A and 41B also operating as abnormality time current controllers, and first and second inverter circuits 42A and 42B that receive gate signals output from the gate drive circuits 41A and 41B.

Here, when the failure detection signal SAa input from the control operation device 31 is the logical value "0" (normality), the gate drive circuit 41A is configured to output three gate signals of high level to the motor current cutoff circuit 33A, and output the gate signal of high level to a power cutoff circuit 44A. In addition, when the failure detection signal SAa is the logical value "1" (abnormality), the gate drive circuit 41A is configured to output three gate signals of low level to the motor current cutoff circuit 33A at the same time to cut off motor drive currents I1a to I1c, and output the gate signal of low level to the power cutoff circuit 44A to cut off a battery current.

Similarly, when the failure detection signal SAa input from the control operation device 31 is the logical value "0" (normality), the gate drive circuit 41B is configured to output three-gate signals of high level to the motor current cutoff circuit 33B, and output the gate signal of high level to a power cutoff circuit 44B. In addition, when the failure detection signal SAa is the logical value "1" (abnormality), the gate drive circuit 41B is configured to output three gate signals of low level to the motor current cutoff circuit 33B at the same time to cut off motor drive currents I2a to I2c, and output the gate signal of low level to the power cutoff circuit 44B to cut off a battery current.

Further, each of the first and second inverter circuits 42A and 42B receives a battery current of a battery 22 through a noise filter 43 and the power cutoff circuits 44A and 44B, and is respectively connected on the input side with electrolytic capacitors CA and CB for smoothing.

Then, each of the first and second inverter circuits 42A and 42B includes six field effect transistors (FETs) Q1 to Q6 operating as switching elements, and has a configuration in which three switching arms SAa, SAb, and SAc are connected in parallel and two FETs are connected in series in each of three switching arms SAa, SAb, and SAc. Then, the FETs Q1 to Q6 included in the first inverter circuit 42A receive the gate signals output from the gate drive circuit 41A, and the motor drive current I1a of A phase, the motor drive current I1b of B phase, and the motor drive current I1c of C phase are supplied from between the FETs in each of the switching arms SAa, SAb, and SAc through the motor current cutoff circuit 33A to the motor windings La, Lb, and Lc of the respective phases of the electric motor 12. Further, the FETs Q1 to Q6 included in the second inverter circuit 42B receive gate signals output from the gate drive circuit 41B, and the motor drive current I2a of A phase, the motor drive current I2b of B phase, and the motor drive current I2c of C phase are electrically conductive from between the FETs in each of the switching arms SAa, SAb, and SAc through the motor current cutoff circuit 33B to the motor windings La, Lb, and Lc of the respective phases of the electric motor 12.

It is to be noted that the motor current cutoff circuit 33A includes three FETs QA1 to QA3 for cutting off the current, and the motor current cutoff circuit 33B includes three FETs QB1 to QB3 for cutting off the current.

Next, a configuration of an electronic control unit 50 operating as the motor controller 20 will be described by using FIG. 3 to FIG. 9.

In FIG. 3 to FIG. 9, mainly, the electronic control unit 50 includes first and second power modules 60A and 60B, an input and output board 70, a control board 80, and a housing 90 configured to accommodate them.

The first power module 60A includes the motor current cutoff circuit 33A, a first inverter circuit 42A including plural switching elements, and a power cutoff circuit 44A. The second power module 60B includes, mainly, the motor current cutoff circuit 33B, a second inverter circuit 42B including plural switching elements, and a power cutoff circuit 44B.

The input and output board 70 includes a power supply input connector (an input connector) 71 to which the power is input, a three-phase output connector (an output connector) 100 of making an output to the electric motor 12, and electronic parts (discrete parts) 73 such as electrolytic capacitors CA and CB, coils 73a and 73b included in a noise filter 43, resistors, and a three-terminal regulator 73. Mounting of the discrete parts 73 onto the input and output board 70 will be described later in detail.

The control board 80 includes the control operation device 31 operating as a controller of controlling output currents from the first and second power modules 60A and 60B, a gate drive device 82A equipped with the gate drive circuit 41A, a gate drive device 82B equipped with the gate drive circuit 41B, and electronic parts such as capacitors, resistors, and a signal input connector 81. The control board 80 and the input and output board 70 each has a multilayer interconnection structure in which wiring layers are arranged on, for example, top and bottom faces, or on top and bottom faces and in inner layers.

The housing 90 mainly includes a case 91 and a cover 95, such that the first and second power modules 60A and 60B, the input and output board 70, and the control board 80 are accommodated in an accommodation portion including the case 91 and the cover 95. The case 91 and the cover 95 are made of an electrically conductive material, for example, Aluminum Die Cast (ADC).

The case 91 has a depressed shape including a ceiling 92, a side wall 93 integrally arranged at the edge of the ceiling 92 to surround the center of the ceiling 92, and an opening portion arranged on the opposite side to the ceiling 92. The cover 95 is attached to cover the opening portion. The case 91 is formed to have a substantially rectangular shape in a plane view, and includes four side walls 93 (93a, 93b, 99c, and 93d). In the four side walls 93a, 93b, 93c, and 93d, the two side walls 93a and 93b face each other in a first direction (left-right direction), and the other two side walls 93c and 93d face each other in a second direction (front-rear direction) perpendicular to the first direction.

Figure 3:
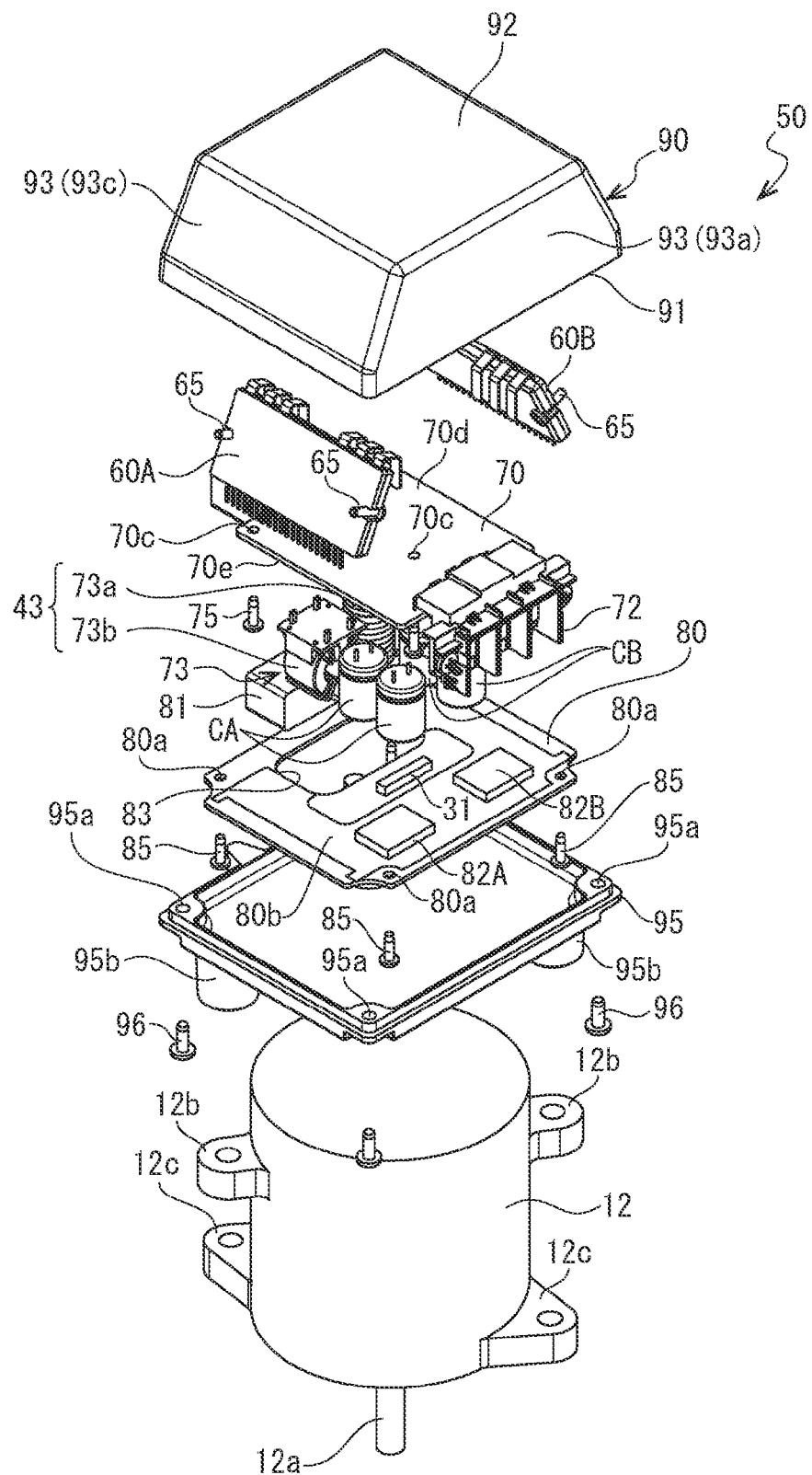
FIG. 3 is an exploded perspective view of an inner configuration of the electric control unit operating as the motor controller.

The first and second power modules 60A and 60B are individually screwed and secured to the two side walls 93c and 93d facing each other of the case 91 with screw members 65 from the inside. In addition, the input and output board 70 is screwed and secured to the ceiling 92 of the case 91 with a screw member 75 from the inside. Further, the control board 80 is screwed and secured to the ceiling 92 of the case 91 with screw members 85 from the inside. Furthermore, the cover 95 is screwed and secured to the side walls 93a, 93b, 93c, and 93d of the case 91 with screw members 96 from its outer side. The input and output board 70 and the control board 80 face each other with a predetermined space D (see FIG. 9) in a thickness direction of the electronic control unit 50, that is an up-down direction. In FIG. 3, the input and output board 70 is arranged above the control board 80 with the top being set to "up" and the bottom being set to "down".

Figure 4:
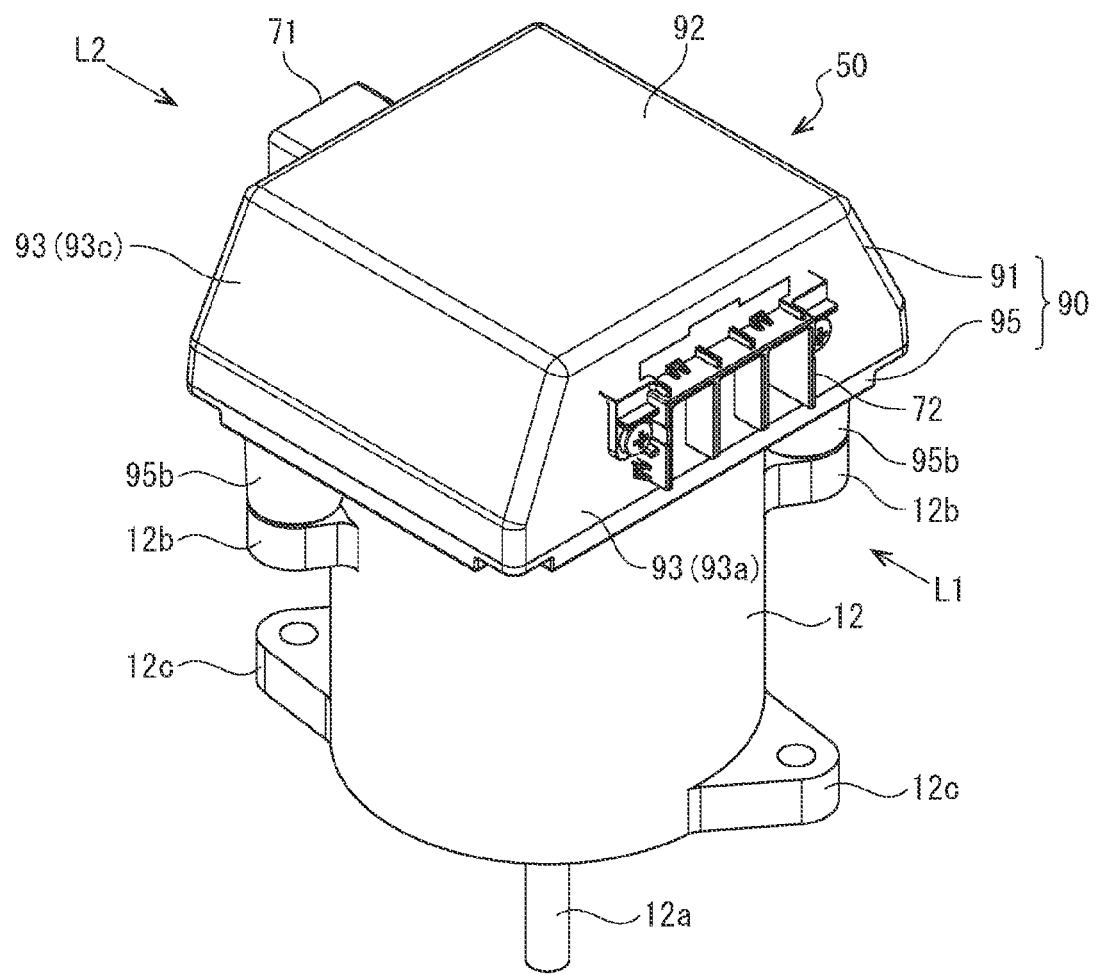
FIG. 4 is a perspective view of an outer configuration of the electric control unit.
Figure 5:
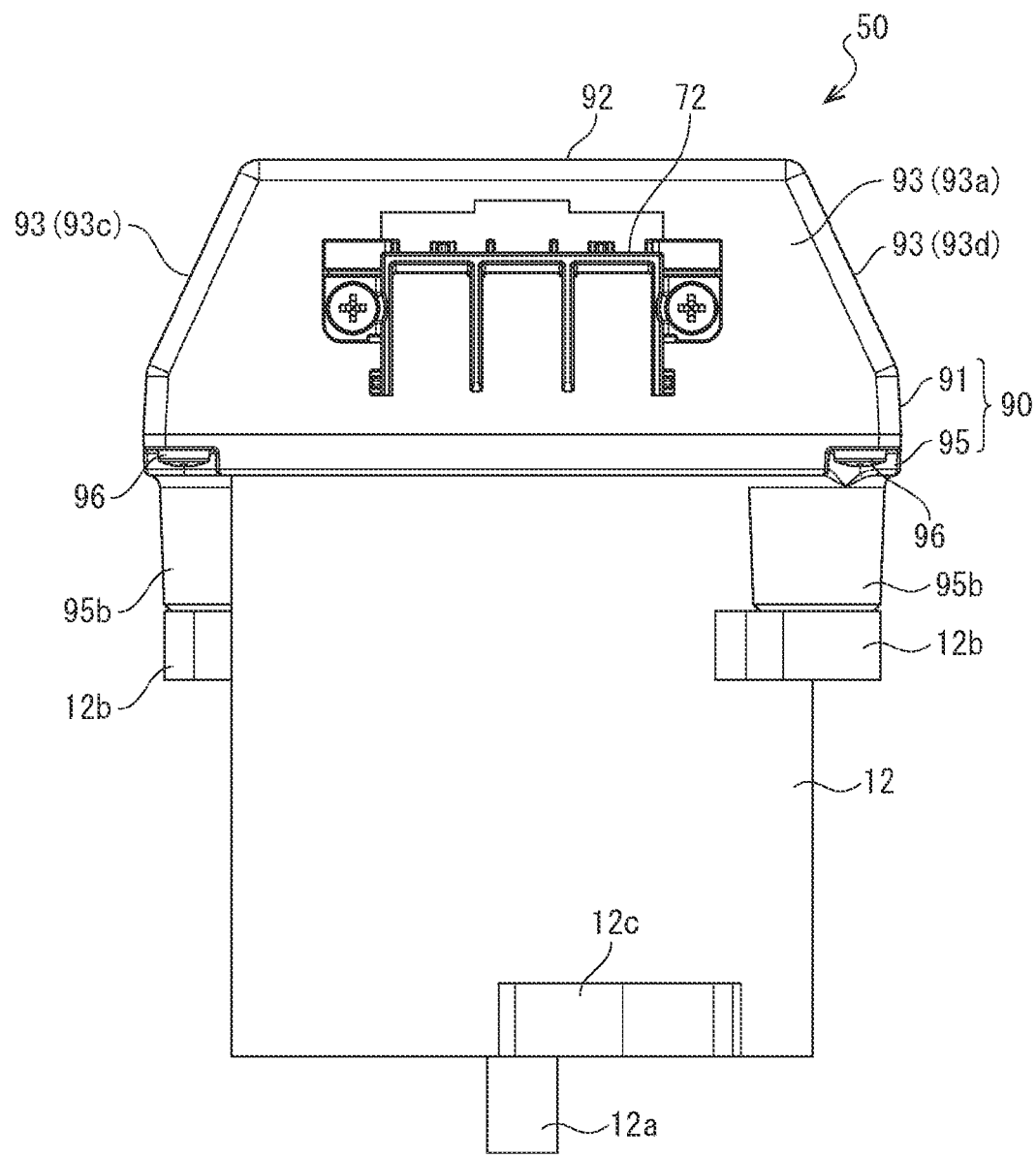
FIG. 5 is a first side view of the electric control unit when viewed from an arrow L1 direction.
Figure 6:
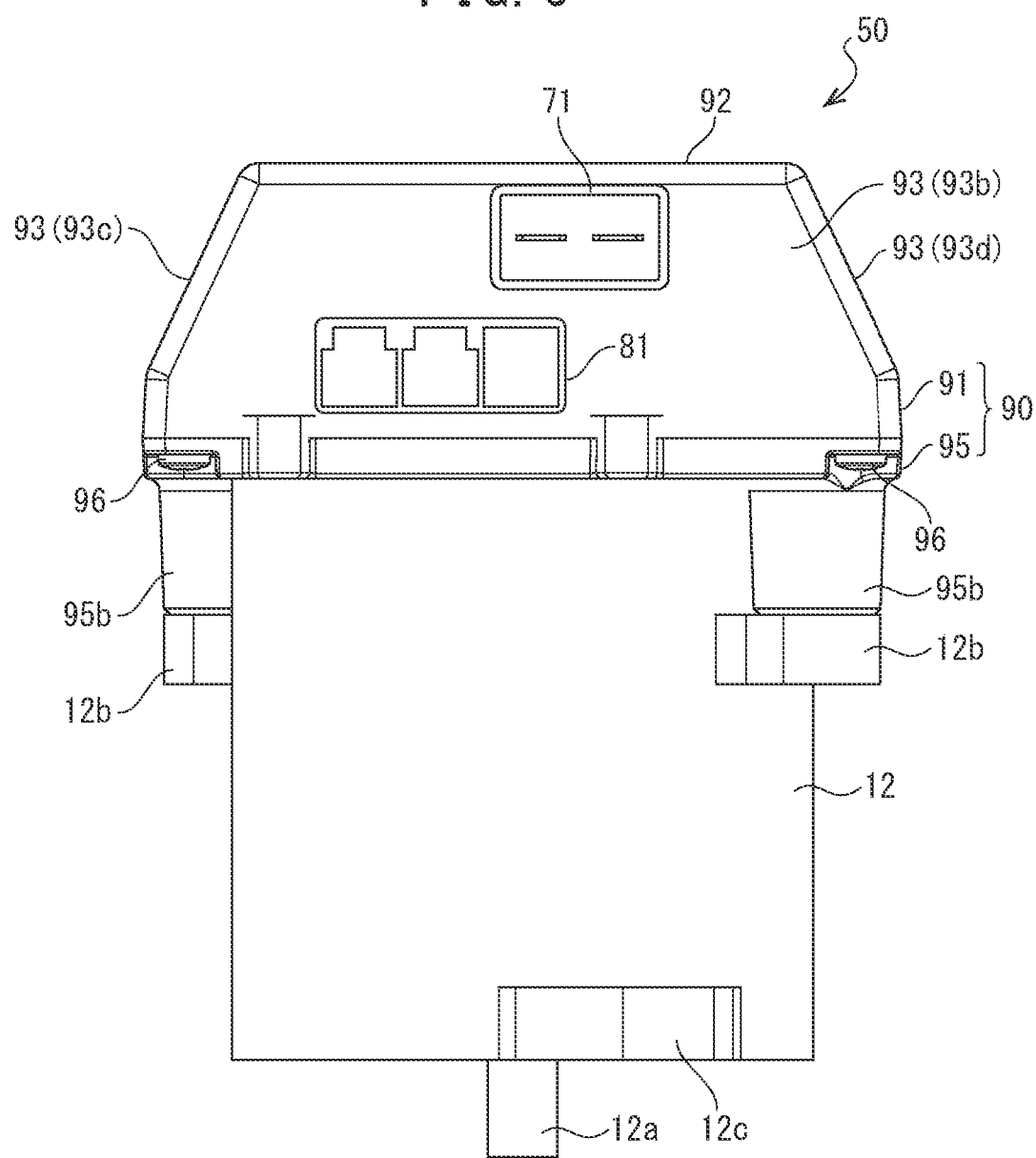
FIG. 6 is a second side view of the electric control unit when viewed from an arrow L2 direction.

The three-phase output connector 72 of the input and output board 70 is exposed outwardly from the side wall 93a of the case 91 (see FIG. 4 and FIG. 5). In addition, the power supply input connector 71 of the input and output board 70 and the signal input connector 81 of the control board 80 are exposed outwardly from the side wall 93b of the case 91 (see FIG. 6).

Figure 7:
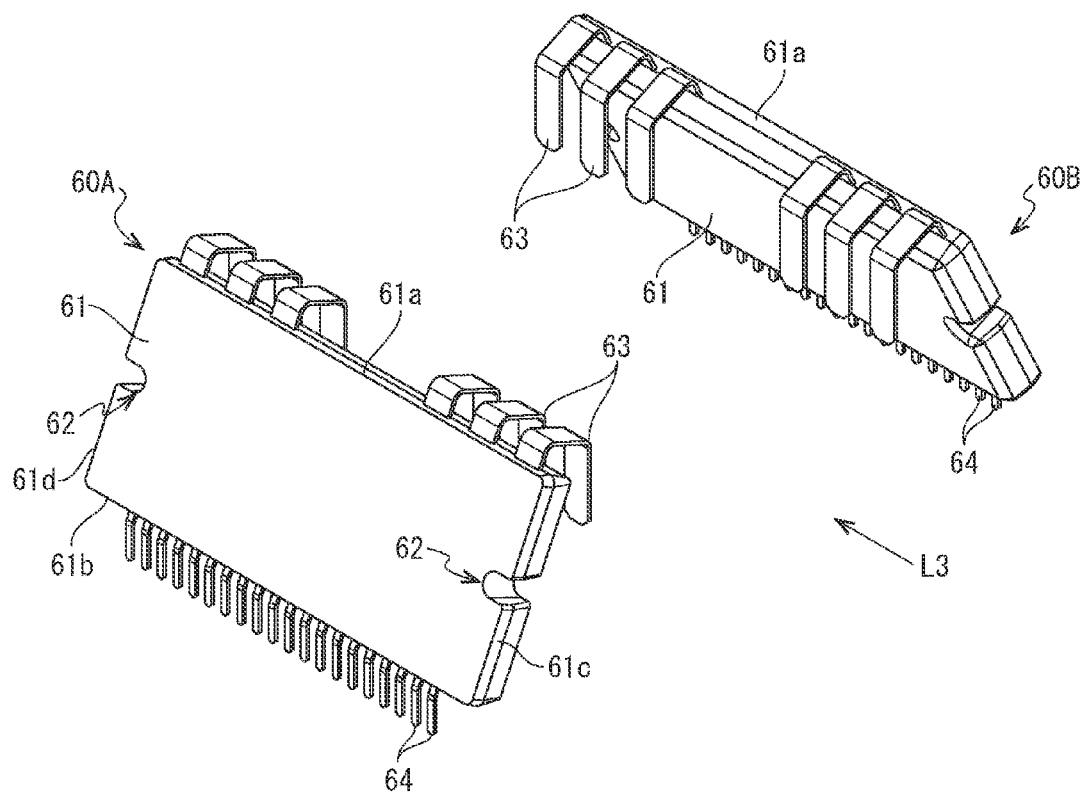
FIG. 7 is a perspective view of a power module of FIG. 3.
Figure 8:
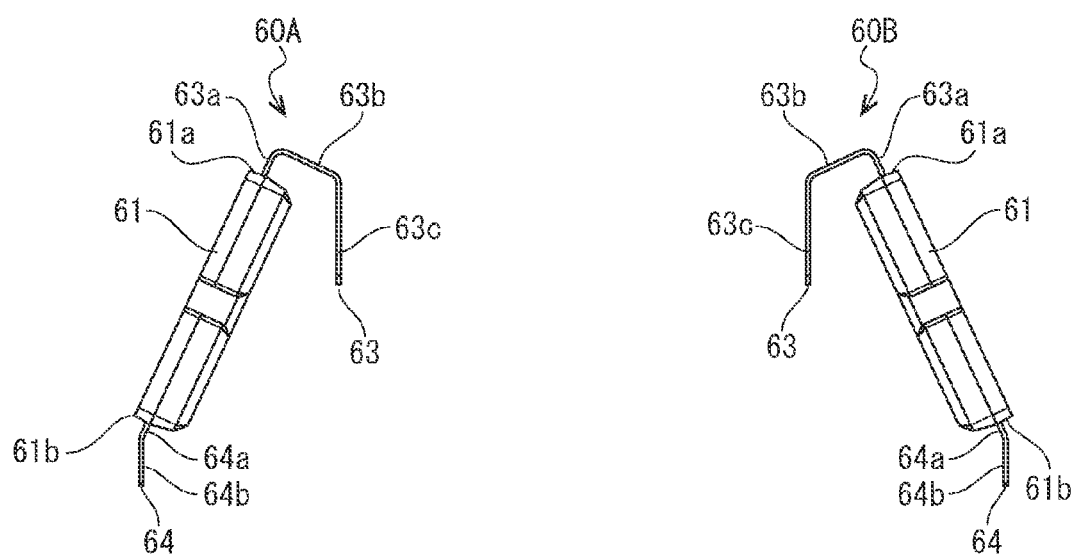
FIG. 8 is a view of the power module when viewed from an arrow L3 direction of FIG. 7.

As illustrated in FIG. 7 and FIG. 8, each of the first and second power modules 60A and 60B includes a seal body 61, plural first leads 63, and plural second leads 64. Each of the first and second power modules 60A and 60B has a package structure of a bidirectional lead array type.

The seal body 61 is formed to have a rectangular plane shape in a plane view, and is formed in rectangular having, for example, two long sides 61a and 61b and two short sides 61c and 61d in one embodiment of the present invention. The seal body 61 is made of, for example, an insulating resin or ceramics. The seal body 61 of the first power module 60A mainly seals the switching elements included in the first inverter circuit 42A. The seal body 61 of the second power module 60B mainly seals the switching elements included in the second inverter circuit 42B.

Plural first and second leads 63 and 64 are not illustrate in detail, but they extend over the inside and outside of the seal body 61, and includes an inner lead part located at the inside of the seal body 61 and an outer lead part located at the outside of the seal body 61.

Each of the plural first leads 63 extends along one long side 61a of two long sides 61a and 61b of the seal body 61, at the outer lead part located at the outside of the seal body 61. Each of plural second leads 64 along the other one long side 61b of the two long sides 61a and 61b of the seal body 61, at the outer lead part located at the outside of the seal body 61.

Each of the plural first and second leads 63 and 64 is formed by bending in plural steps at the outer lead part located at the outside of the seal body 61.

Each of the outer lead parts of the plural first leads 63 is formed by bending, for example, in three steps, including a first part 63a that protrudes from one long side 61a of the seal body 61, a second part 63b that bends in a thickness direction of the seal body 61 from the first part 63a, and a third part 63c that bends to a back face side of the seal body 61 from this second part 63b.

Each of the outer lead parts of the plural second leads 64 is formed by bending, for example, in two steps, including a first part 64a that protrudes from the other long side 61b of the seal body 61, and a second part 64b that bends to slant toward a back face side of the seal body 61 from the first part 64a.

In the first and second power modules 60A and 60B, each of the plural first leads 63 are, for example, soldered onto the wiring of the input and output board 70 and connected electrically and mechanically. In addition, each of the plural second leads 64 are, for example, soldered onto the wiring of the control board 80 and connected electrically and mechanically.

Here, the plural first leads 63 include the first lead 63 electrically connected to a terminal of the power supply input connector 71 and the first lead 63 electrically connected to a terminal of the three-phase output connector 72, through electric wiring of the input and output board 70. In addition, the plural second leads 64 include the second lead 64 electrically connected to a terminal of the signal input connector 81 through electric wiring of the control board 80.

Figure 17:
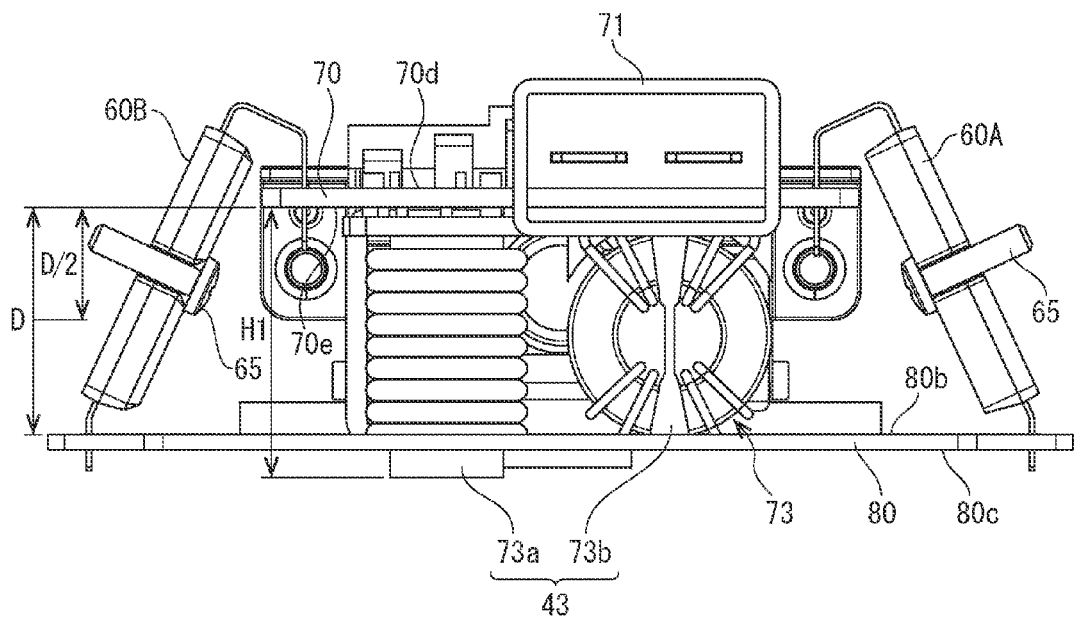
FIG. 17 is a first side view when viewed from an arrow L9 direction of FIG. 15 (i.e., an identical direction to the arrow L5 direction)
Figure 18:
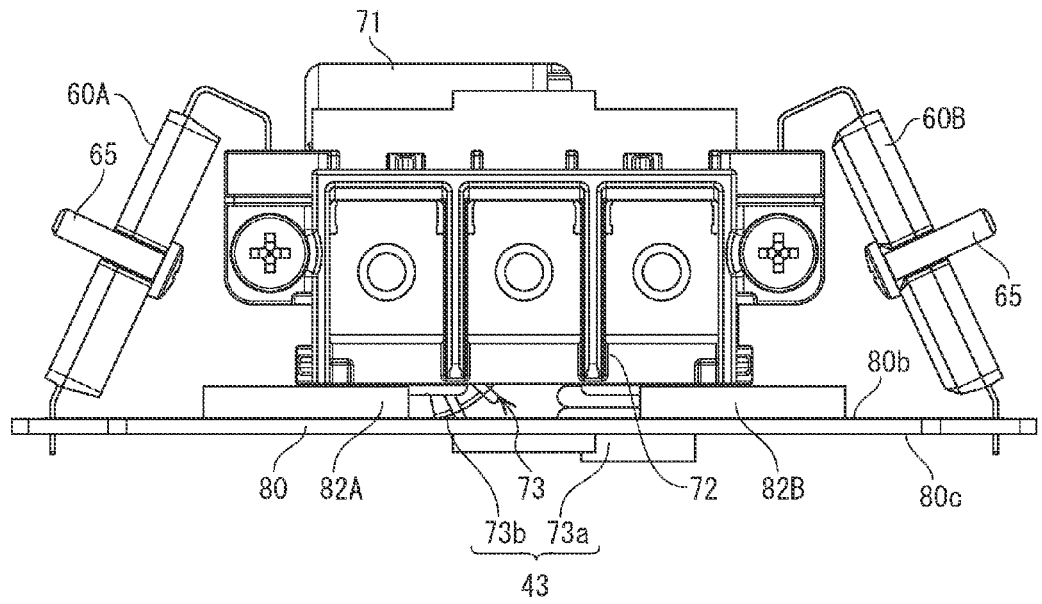
FIG. 18 is a second side view when viewed from an arrow L10 direction of FIG. 15 (i.e., an identical direction to the arrow L6 direction)

It is to be noted that the first lead 63 electrically connected to the terminal of the three-phase output connector 100 in the first power module 60A operates as an output terminal 66A of the first power module 60A (see FIG. 17), and the first lead 63 electrically connected to the terminal of the three-phase output connector 100 in the second power module 60B operates as an output terminal 66B of the second power module 60B (see FIG. 17).

The electronic control unit 50 configured as described above is attached at an end face on the opposite side of an output shaft 12a of the electric motor 12, and is screwed and secured with a screw member, not illustrated. On the bottom face of the cover 95 included in the electronic control unit 50, as illustrated in FIG. 3 to FIG. 6, plural boss portions 95b are formed to protrude. In attaching the electronic control unit 50 onto the electric motor 12, the boss portions 95b are mounted on plural first attachment flange portions 12b arranged on the electric motor 12, and in addition, the bottom face of the cover 95 is mounted on an end face on the opposite side to the output shaft 12a. Then, by screwing and securing the first attachment flange portions 12b and the boss portions 95b with screw members, not illustrated, the electronic control unit 50 is attached onto the electric motor 12. It is to be noted that plural second attachment flange portions 12*c* for attaching other members are provided on the output shaft 12*a* side of the electric motor 12.

Next, a manufacturing method (assembling method) of the electronic control unit 50 will be described with reference to FIG. 3.

Firstly, the first and second power modules 60A and 60B, the input and output board 70, the control board 80, the case 91, and the cover 95 are prepared. On the input and output board 70, the electronic parts (discrete parts) 73 such as the power supply input connector 71, the three-phase output connector 72, the electrolytic capacitors CA and CB, the coils 73*a* and 73*b* included in the noise filter 43, the resistors, and the three-terminal regulator are mounted. On the control board 80, electronic parts such as the control device (control operation device 31) that controls output currents from the first and second power modules 60A and 60B, and the gate drive device (gate drive circuits 41A and 41B) are mounted. Further, the electronic parts such as the capacitors, the resistors, and the signal input connector 81 are mounted.

Next, the first and second power modules 60A and 60B are individually screwed and secured onto the side walls 93*c* and 93*d* of the case 91 with screw members 65 from the inside.

Then, the input and output board 70 is screwed and secured onto the ceiling 92 of the case 91 with the screw members 75 from the inside. The input and output board 70 includes plural screw through holes 70*c*. In screwing and securing, the screw members 75 are respectively inserted through the screw through holes 70*c*. In addition, when the input and output board 70 is screwed and secured onto the ceiling 92 of the case 91, plural first leads 63 of the first and second power modules 60A and 60B are inserted into through holes (not illustrated) arranged in the wiring of the input and output board 70.

Next, the control board 80 is screwed and secured onto the ceiling 92 of the case 91 with the screw members 85 from the inside. The control board 80 includes plural screw through holes 80*a*. In screwing and securing, the screw members 85 are respectively inserted into the screw through holes 80*a*. Further, when the control board 80 is screwed and secured onto the ceiling 92 of the case 91, the plural second leads 64 of the first and second power modules 60A and 60B are inserted into through holes (not illustrated) arranged in the wiring of the control board 80.

Then, plural first leads 63 of the first and second power modules 60A and 60B are electrically and mechanically connected to the through holes arranged in the input and output board 70 by soldering, and at the same time, the plural second leads 64 of the first and second power modules 60A and 60B are electrically and mechanically connected to the through holes arranged in the control board 80 by soldering.

Then, the cover 95 is attached to cover the opening of the case 91, and is screwed and secured to the side wall 93 of the case 91 with screw members 96 from the outside of the cover 95. Plural screw through holes 95*a* are arranged in the cover 95, and in screwing and securing, the screw members 96 are respectively inserted into the through holes 95*a*.

Accordingly, the electronic control unit 50 in one embodiment of the present invention is almost produced.

Figure 9:
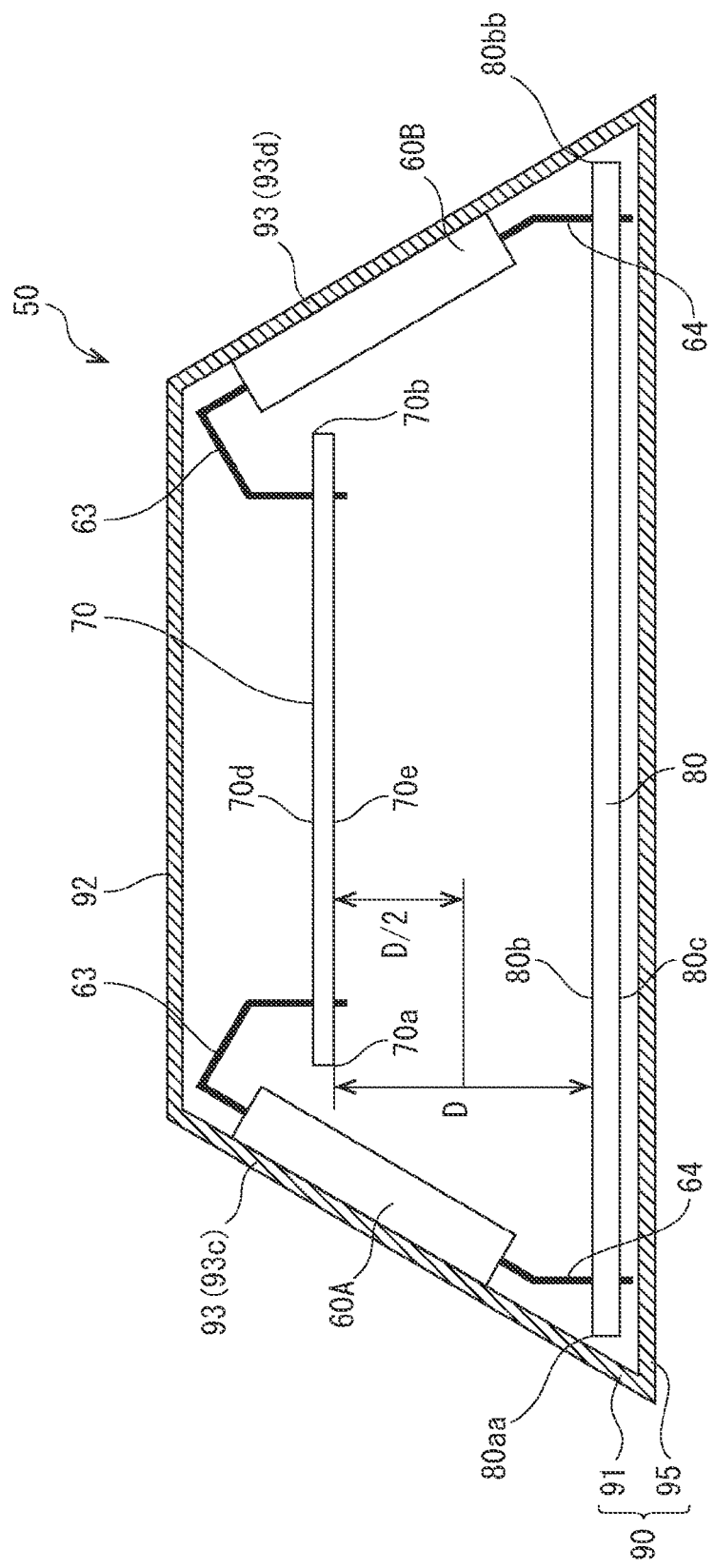
FIG. 9 is a cross-sectional view schematically illustrating an outline configuration of a housing.
Figure 10:
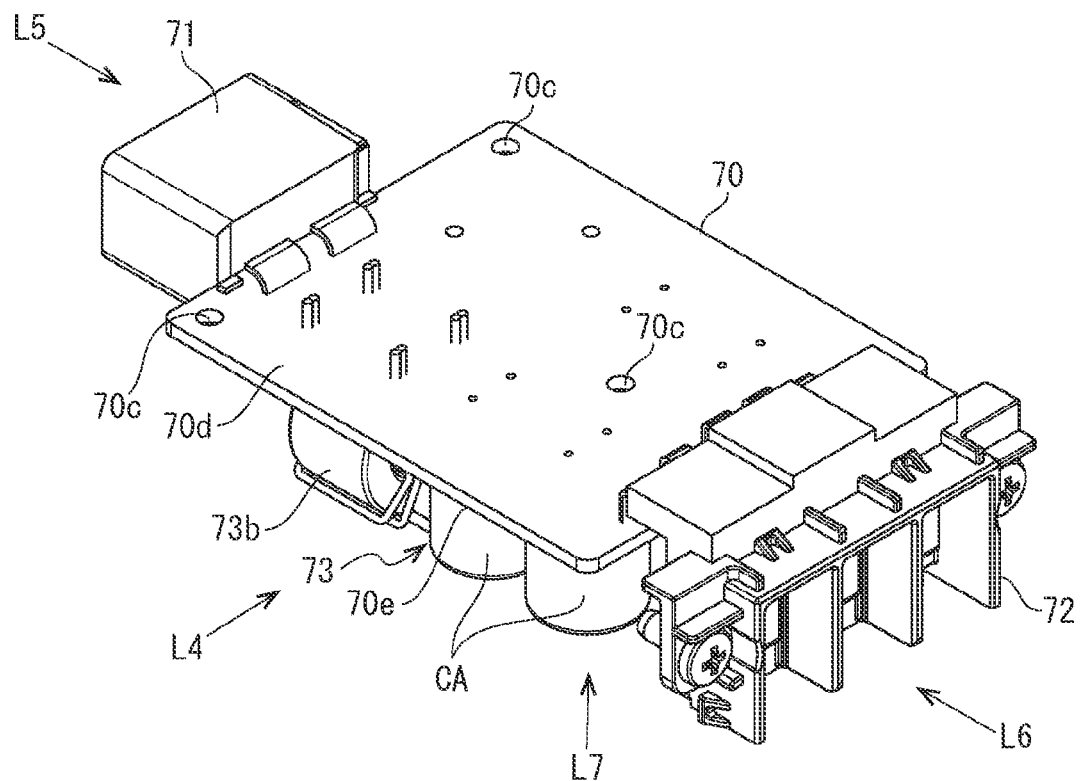
FIG. 10 is a perspective view of an input and output board of the electric control unit on which a power supply input connector, a three-phase output connector, and electronic parts (i.e., discrete parts) are mounted.

In the electronic control unit 50, as illustrated in FIG. 9, the input and output board 70 and the control board 80 are arranged to face each other with a predetermined space D in a direction of the thickness of the electronic control unit 50, that is in the up-down direction. In one embodiment of the present invention, the input and output board 70 is arranged closer to the ceiling 92 of the case 91 than to the control board 80, the control board 80 is arranged closer to the cover 95 than to the input and output board 70, that is, arranged on the lower side.

The input and output board 70 is formed to have a plane size that is smaller than the plane size of the control board 80. The input and output board 70 has two sides 70*a* and 70*b* facing each other, and the control board 80 has two sides 80*aa* and 80*bb* facing each other.

One side 70*a* of the input and output board 70 is located on the same side with one side 80*aa* of the control board 80, and is located on an inner side than the one side 80*aa*. The other side 70*b* of the input and output board 70 is located on the same side with the other side 80*bb* of the control board 80, and is located on an inner side than the other side 80*bb*.

The first power module 60A is arranged to intersect one side 70*a* of the input and output board 70 on the one sides 70*a* and 80*aa* side of the input and output board 70 and the control board 80. The second power module 60B is arranged to intersect one side 70*b* of the input and output board 70 on the other sides 70*b* and 80*bb* side of the input and output board 70 and the control board 80.

Next, mounting of the electronic parts (i.e., discrete parts) onto the input and output board and a relationship between the input and output board on which the electronic parts are mounted and the control board will be described with reference to FIG. 10 to FIG. 19.

Figure 11:
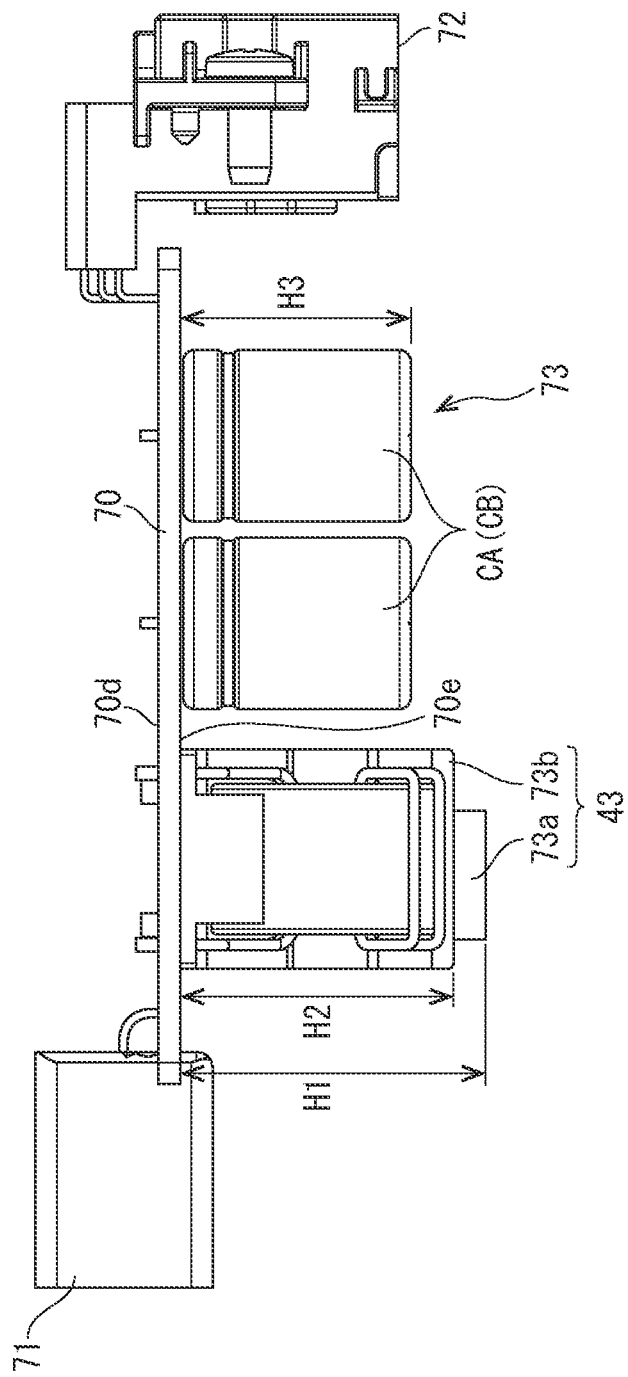
FIG. 11 is a front view of the input and output board when viewed from an arrow L4 direction of FIG. 10.
Figure 12:
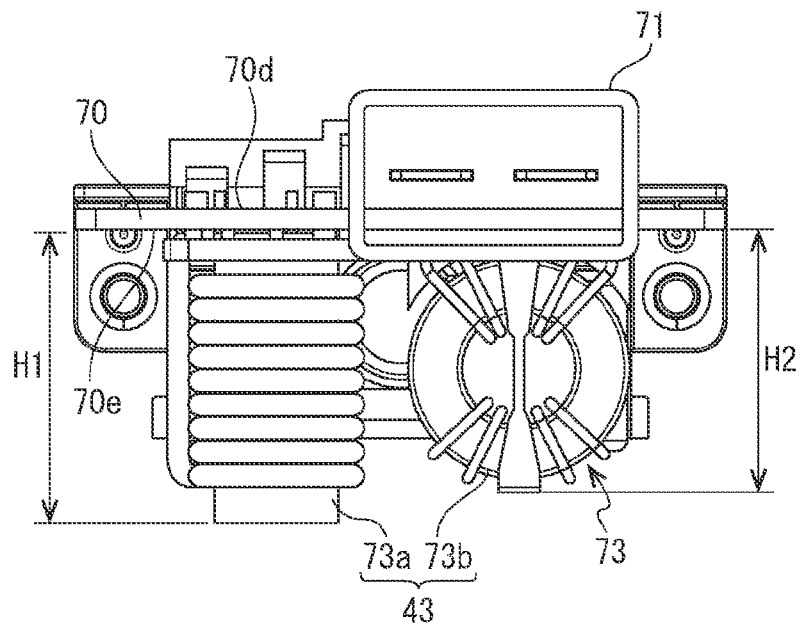
FIG. 12 is a first side view of the input and output board when viewed from an arrow L5 direction of FIG. 10 (i.e., an identical direction to the arrow L2 direction)
Figure 13:
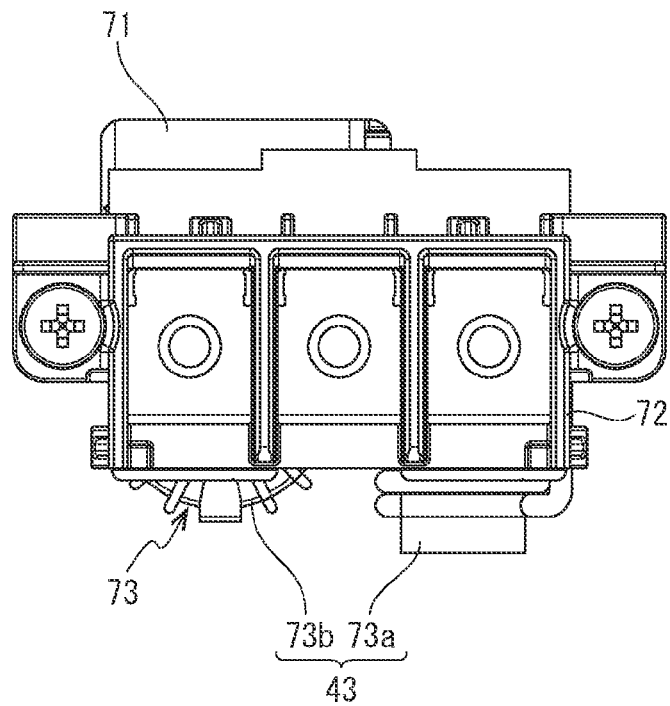
FIG. 13 is a second side view of the input and output board when viewed from an arrow L6 direction of FIG. 10 (i.e., an identical direction to the arrow L1 direction)
Figure 14:
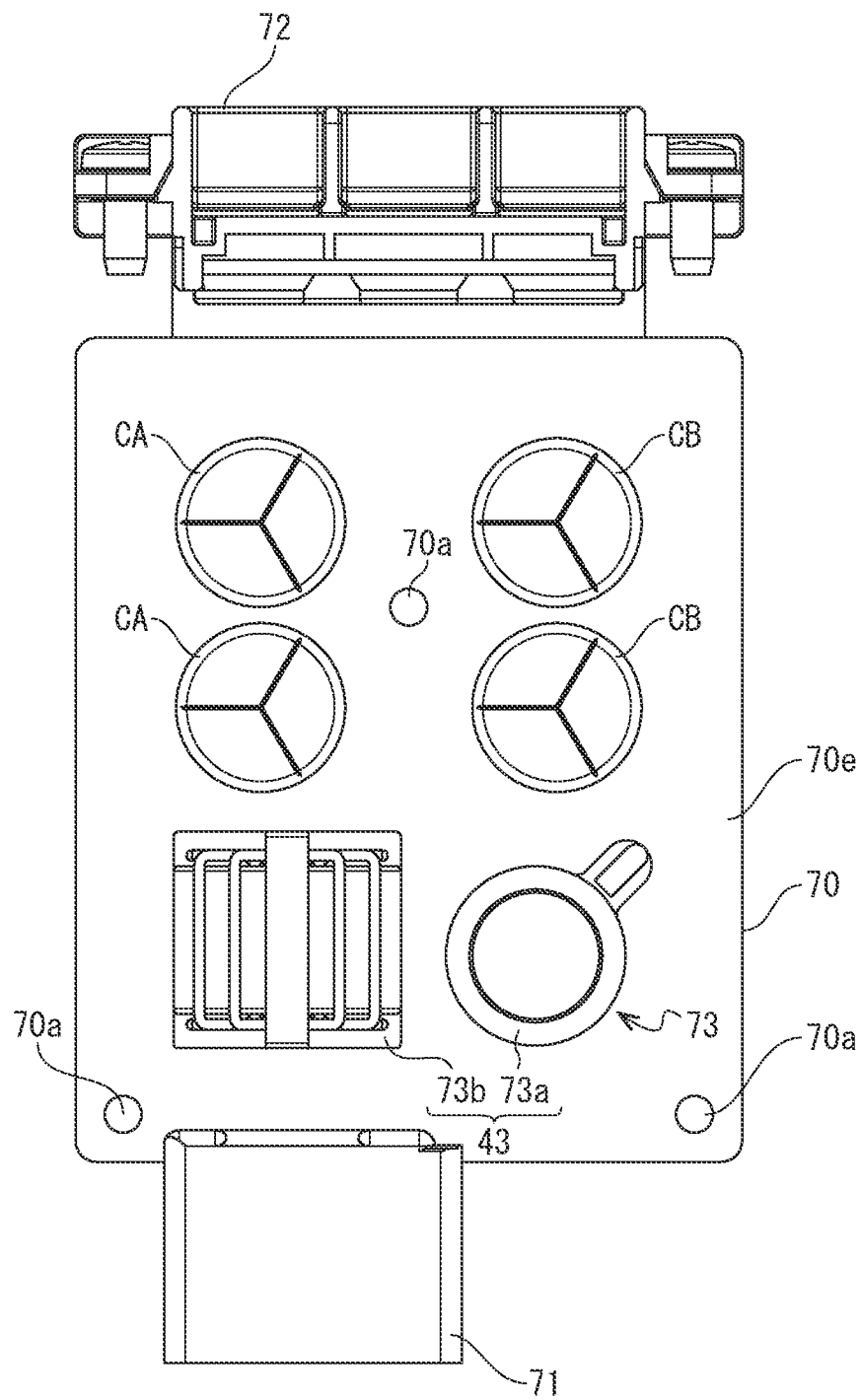
FIG. 14 is a bottom view of the input and output board when viewed from an arrow L7 direction of FIG. 10.
Figure 15:
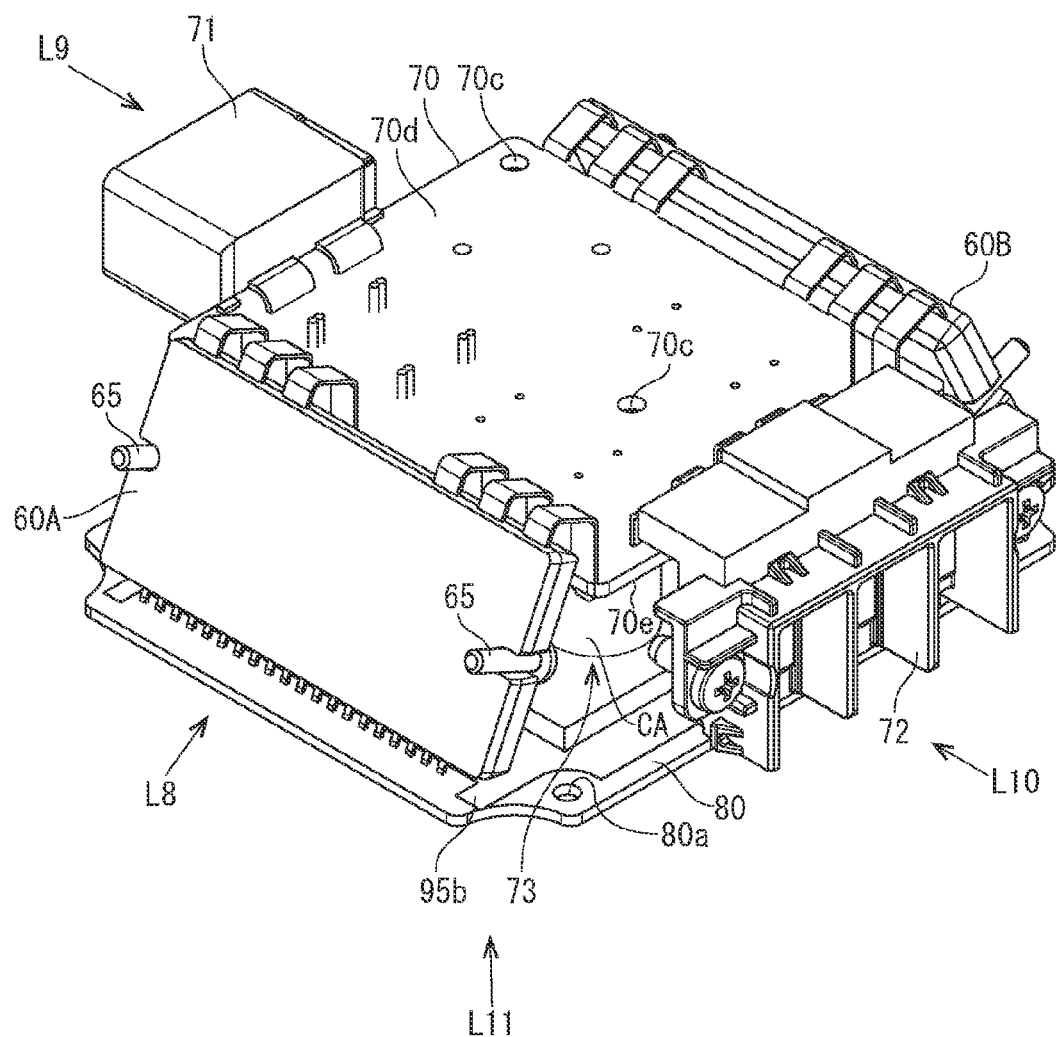
FIG. 15 is a perspective view in a state where the input and output board on which electronic parts (i.e., discrete parts) illustrated in FIG. 10 and the control board are coupled by the first and second power modules.
Figure 16:
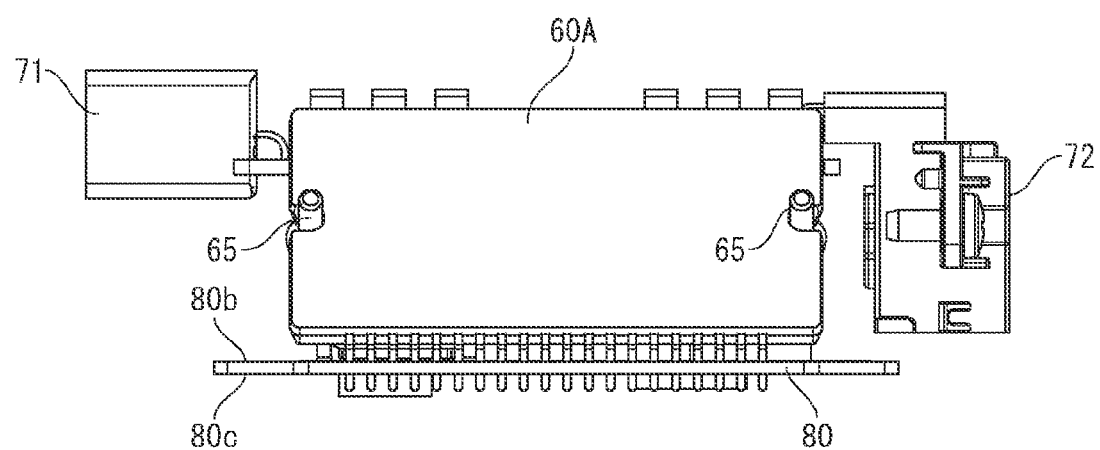
FIG. 16 is a front view when viewed from an arrow L8 direction of FIG. 15 (i.e., an identical direction to the arrow L4 direction)

As described above, the electronic parts 73 mounted on the input and output board 70 are discrete parts including, for example, electrolytic capacitors CA and CB, the coils 73*a* and 73*b* included in the noise filter 43, the resistors, and the three-terminal regulators. Among these discrete parts, the electrolytic capacitors CA and CB, the coils 73*a* and 73*b* included in the noise filter 43 are electronic parts 73 relatively tall in height. In other words, a height H1 of the coil 73*a*, a height H2 of the coil 73*b*, and a height H3 of the electrolytic capacitors CA and CB, which are the electronic parts 73 considered to be relatively tall in heights, as illustrated in FIG. 11, are larger than a half, which is D/2, a distance D between the input and output board 70 and the control board (see FIG. 9 and FIG. 17).

The discrete parts such as the coils 73*a* and 73*b* and the electrolytic capacitors CA and CB, which are the electronic parts 73 considered to be relatively tall in height are mounted only on a face of the input and output board 70 facing the control board 80, that is, only on the bottom face 70*e* of the input and output board 70. As illustrated in FIG. 10 to FIG. 19, the electronic parts 73 are not mounted on a top face 70*d* of the input and output board 70, the top face 80*b* of the control board 80, or the bottom face 80*c* of the control board 80.

Thus, the discrete parts which are the electronic parts 73 considered to be relatively tall in height are mounted only on a face of the input and output board 70 facing the control board 80, that is, only on the bottom face 70*e* of the input and output board 70. Accordingly, the height size of the electronic control unit 50 can be lowered without limiting the mounting arrangement of the input and output board 70 or the control board 80 facing each other in the up-down direction.

In other words, by mounting the discrete parts that are electronic parts 73 considered to be relatively high on a face (the bottom face 70*e*) of the input and output board 70 facing the control board 80, a space between the input and output board 70 and the control board 80 can be utilized for the mounting of the discrete parts of the electronic parts 73 considered to be relatively high, and the size of the electronic control unit 50 can be lowered. Also, when the arrangements of the above-described discrete parts are divided into the face (the bottom face 70e) of the input and output board 70 facing the control board 80 and the face (the top face 80b) of the control board 80 facing the input and output board 70 as disclosed in Patent Literature 1, the height of the electronic control unit 50 can be lowered. However, such a configuration brings an inconvenience of limiting the mounting arrangements of the input and output board 70 and the control board 80 in order to avoid a contact between the discrete parts arranged on both of the input and output board 70 and the control board 80.

The discrete parts that are considered to be electronic parts 73 tall in height are mounted on the face (bottom face 70e) facing the control board 80 such that the height direction of the discrete parts should be the vertical direction that is perpendicular to the extending direction of the face (bottom face 70e) of the input and output board 70 facing the control board 80.

Figure 19:
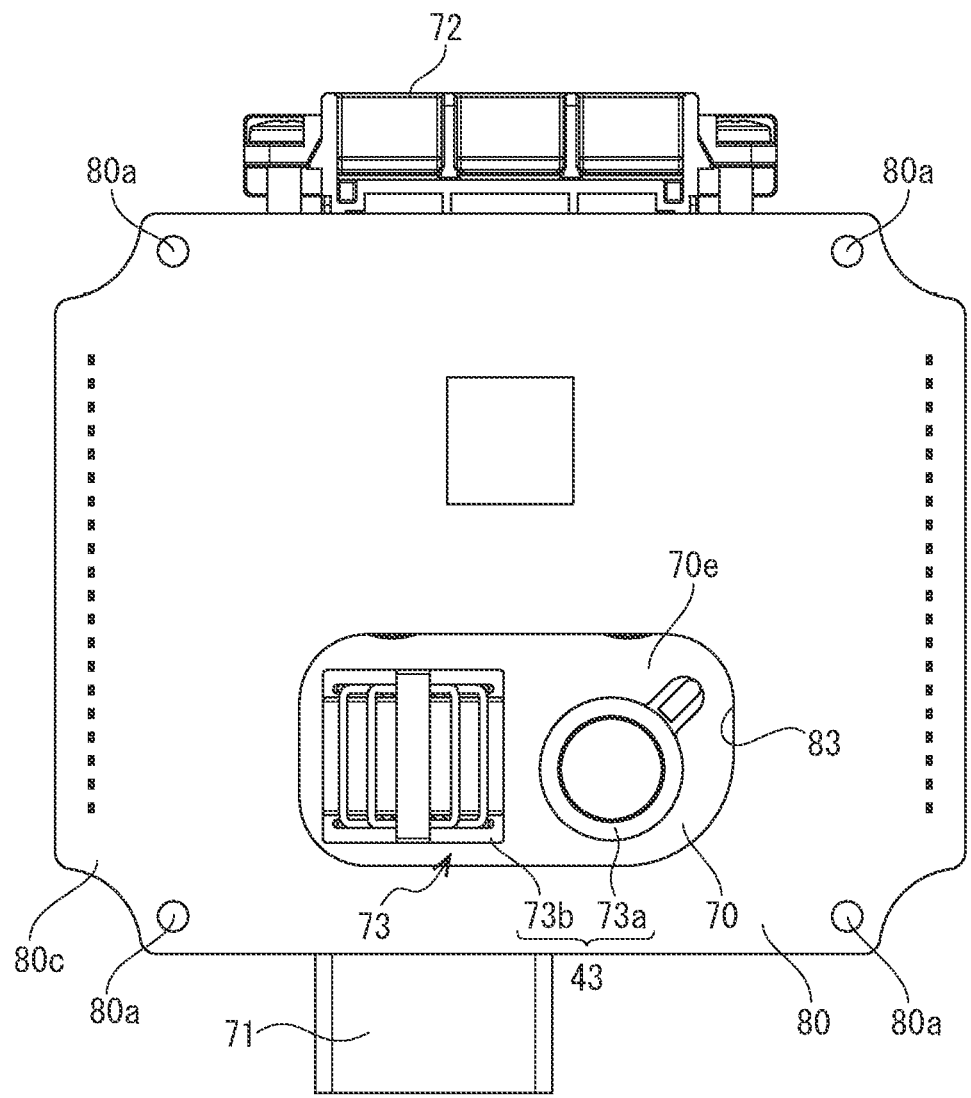
FIG. 19 is a bottom view when viewed from an arrow L11 direction of FIG. 15 (i.e., an identical direction to the arrow L7 direction)

Herein, among the discrete parts that are considered to be high electronic parts 73, a coil 73a is mounted onto a bottom face 70e of the input and output board 70 such that a height H1 of the coil 73a is, as illustrated in FIG. 17, larger than a distance D between the input and output board 70 and the control board, and the height direction of the coil 73a is the vertical direction. For this reason, an end of the mounted coil 73a abuts with the control board 80. However, as illustrated in FIG. 19, the control board 80 has an opening (through hole) 83 into which the coil 73a can be inserted. Accordingly, the end of the mounted coil 73a penetrates through the opening 83 of the control board 80, and protrudes from a bottom face 80c of the control board 80.

Thus, when the discrete parts that are considered to be high electronic parts 73 is higher than the distance D between the input and output board 70 and the control board 80, the distance D between the input and output board 70 and the control board 80 vertically facing each other has to be longer, unless the opening (through hole) 83 into which the discrete parts can be inserted is formed in the control board 80. When the discrete parts that are considered to be high electronic parts 73 are higher than the distance D between the input and output board 70 and the control board 80, the opening 83 into which the discrete parts can be inserted is formed in the control board 80. This configuration can downsize the electronic control unit 50 without increasing the distance D between the input and output board 70 and the control board 80.

It is to be noted that the opening (through hole) 83 also allows insertion of a coil 73b, as illustrated in FIG. 19. As illustrated in FIG. 17, since an end of the coil 73b also comes into contact with a top face 80b of the control board 80, the opening (through hole) 83 also allows the insertion of the coil 73b.

In addition, the discrete parts that are considered to be high electronic parts 73 may be mounted on a face (bottom face 70e) facing the control board 80 such that the height direction is substantially parallel to the extending direction of the face (bottom face 70e) of the input and output board 70 facing the control board 80, in other words, such that the discrete parts lie. By mounting the discrete parts that are considered to be the high electronic parts 73 to lie on the face (bottom face 70e) facing the control board 80, the distance between the input and output board 70 and the control board 80 vertically facing each other can be reduced more, and the height of the electronic control unit 50 can be reduced.

Heretofore, the embodiments of the present invention have been described, but the present invention is not limited to them and various kinds of changes, modifications, and improvements are applicable.

For example, the control board 80 is arranged closer to the cover 95 than to the input and output board 70, in other words, the control board 80 is arranged on the lower side. However, the control board 80 may be arranged on an upper side of the input and output board 70. In this case, the discrete parts that are considered to be the high electronic parts 73 are mounted only on a top face of the input and output board 70.

Figure 20:
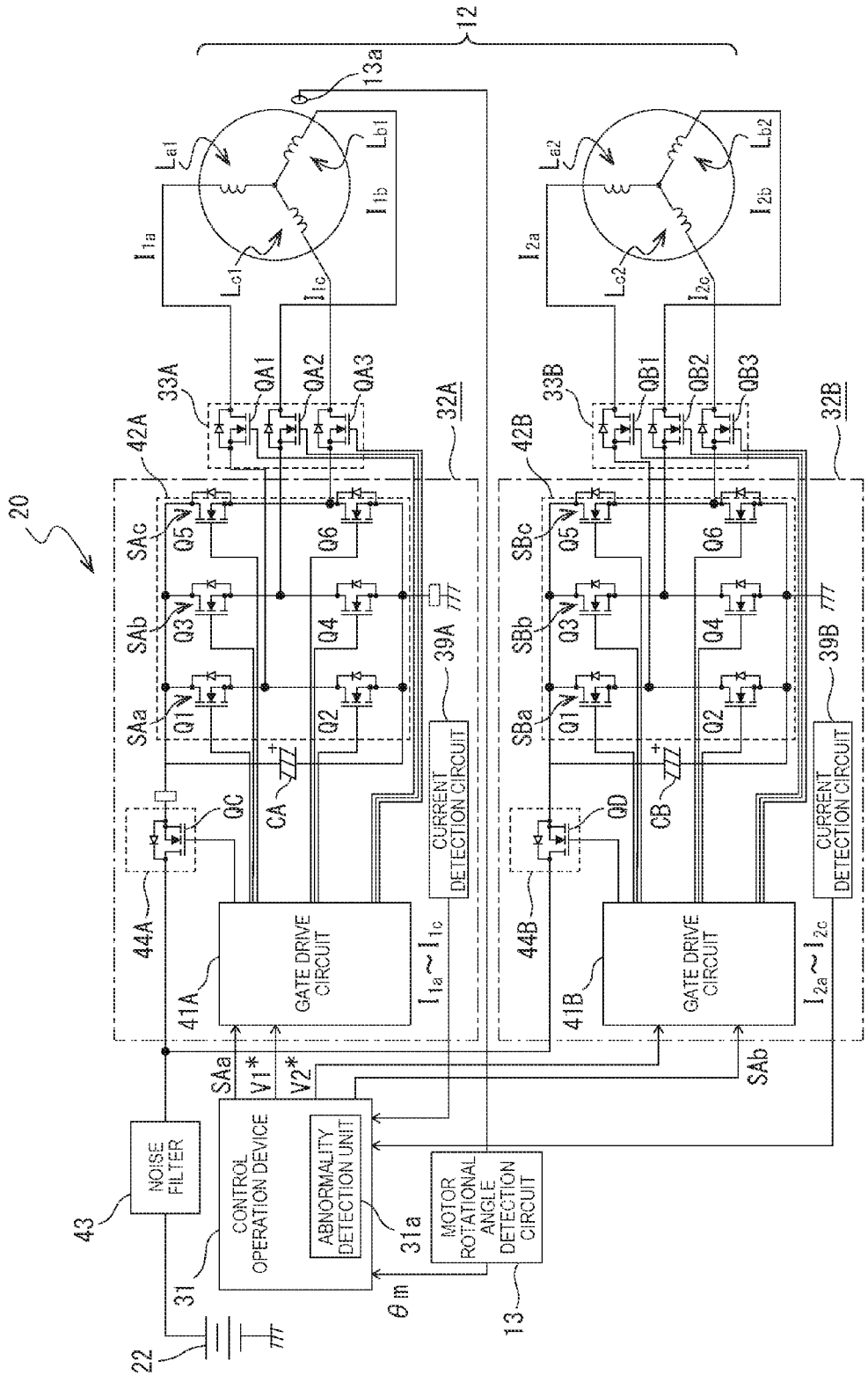
FIG. 20 is a block diagram of a control system of the motor controller of the electric power steering device illustrated in FIG. 1, in another embodiment of the present invention.

Also, the electric motor 12 that is coupled with the reduction gear 11 illustrated in FIG. 1 and that produces the steering assistance force may be configured with a single electric motor including two systems of the motor windings, as illustrated in FIG. 20. Such an electric motor 12 is configured with, for example, a three-phase brushless motor. Motor windings La1, Lb1, and Lc1 of the A phase, B phase, and C phase included in the three phases of the first system and motor windings La2, Lb2, and Lc2 of the A phase, B phase, and C phase included in the three phases of the second system are wound around the slots of the stator. One ends of the motor windings La1, Lb1, and Lc1 of the first system are connected with each other to forma star connection, and the other ends thereof are connected to the motor controller 20, so that the motor drive currents I1a, I1b, and I1c are supplied. Also, one ends of the motor windings La2, Lb2, and Lc2 of the second system are connected with each other to forma star connection, and the other ends thereof are connected to the motor controller 20, so that the motor drive currents I2a, I2b, and I2c are supplied.

Heretofore, the present invention has been described specifically based on the above-described embodiments, but the present invention is not limited to the above-described embodiments, and various changes are applicable within a range where the scope is not departed.

In addition, in the above-described electronic control unit, the discrete part may be mounted on the face of the input and output board facing the control board, such that a height direction of the discrete part is a vertical direction that is perpendicular to an extending direction of the surface of the input and output board, the surface facing the control board.

Further, in the above-described electronic control unit, the discrete part may be mounted on the face of the input and output board facing the control board, such that a height direction of the discrete part is substantially parallel to an extending direction of the surface of the input and output board, the surface facing the control board.

Furthermore, in the above-described electronic control unit, an opening into which the discrete part may be insertable is formed in the control board.

In addition, according to another aspect of the present invention, there is provided an electronic control unit mounted on an end face of a frame of a motor frame located in an extending line of a motor output shaft of the electric motor. A power module including switching elements, an input and output board on which an input connector and an output connector are mounted, and a control unit configured to control an output current from the power module are accommodated in a housing to control driving of the electric motor. Then, the above-described control board is housed at a position adjacent to the frame end face with respect to the power module and the input and output board.

Further, in the above-described electric control unit, a magnet may be secured on the adjacent side to the motor frame on the motor output shaft of the electric motor, and a magnetism detection element may be arranged to be perpendicular to the axial line of the motor output shaft, and configured to detect a change in magnetic flux of the magnet.

In this situation, the magnet may be secured on the adjacent side to the motor frame of a rotor of the electric motor. Further, instead of the above-described magnetism detection element, a resolver may be configured to detect an angle.

Moreover, an electronic control unit according to yet another aspect of the present invention is configured to control driving of the electric motor, and is mounted on the frame end face of the motor frame located in an extending line of a motor output shaft of the electric motor. Then, a ceiling surface of the housing of the electric control unit has a rectangular shape, when viewed from a extending direction of the motor output shaft, and when a crossing portion is assumed to be a crossing location where two diagonal lines of the ceiling surface having a rectangular shape cross each other, the crossing portion matches the extending line of the motor output shaft.

In addition, in the above-described electronic control unit, a power module including switching elements, an input and output board on which an input connector and an output connector are mounted, and a control unit configured to control an output current from the power module may be accommodated in a housing.

INDUSTRIAL APPLICABILITY

As described above, an electronic control unit, an electric power steering device, and a vehicle, according to the present invention, are useful in reducing the height of the electronic control unit without limiting the mounting arrangements of an input and output board and a control board vertically facing each other.

REFERENCE SIGNS LIST

1 . . . steering wheel, 2 . . . steering shaft, 2a . . . input shaft, 2b . . . output shaft, 3 . . . steering torque sensor, 4 . . . universal joint, 5 . . . lower shaft, 6 . . . universal joint portion, 7 . . . pinion shaft, 8 . . . steering gear, 8a . . . pinion, 8b . . . rack, 9 . . . tie rod, 10 . . . steering assistance mechanism, 11 . . . reduction gear, 12 . . . electric motor, 12a . . . output shaft, 12b . . . first flange portion, 12c . . . second flange portion, 13 . . . motor rotational angle detection circuit, 13a . . . rotational position sensor, La . . . A-phase motor winding, Lb . . . B-phase motor winding, Lc . . . C-phase motor winding, 20 . . . motor controller, 21 . . . speed sensor, 22 . . . battery, 31 . . . control operation device, 32A . . . first motor drive circuit, 32B . . . second motor drive circuit, 33A . . . first motor current cutoff circuit, 33B . . . second motor current cutoff circuit, 39A, 39B . . . current detection circuit, 41A, 41B . . . gate drive circuit, 42A, 42B . . . inverter circuit, 43 . . . noise filter, 44A, 44B . . . power cutoff circuit, 50 . . . electronic control unit, 60A . . . first power module, 60B . . . second power module, 61 . . . seal body, 61a, 61b . . . long side, 61c, 61d . . . short side, 63 . . . first lead, 63a . . . first part, 63b . . . second part, 63c . . . third part, 64 . . . second lead, 64a . . . first part, 64b second part, 65 . . . screw member, 70 . . . input and output board 70c . . . screw through hole, 70d . . . top face of the input and output board, 70e . . . bottom face of the input and output board, 71 . . . power supply input connector (input connector), 73 . . . electronic part (discrete part), 73a . . . coil, 73b . . . coil, 75 . . . screw member, 80 . . . control board, 80a . . . screw through holes, 80b . . . top face of the control board, 80c . . . bottom face of the control board, 81 . . . signal input connector, 82A . . . gate drive device, 82B . . . gate drive device, 83 . . . opening, 85 . . . screw member, 90 . . . housing, 91 . . . case, 92 . . . ceiling, 93a, 93b, 93c, 93d . . . side wall, 95 . . . cover, 95a . . . screw through hole, 95b . . . boss portion, 96 . . . screw member

The invention claimed is:

1. An electronic control unit comprising:
 a power module on which switching elements are mounted;
 an input and output board on which an input connector and an output connector are mounted;
 a control board on which a controller configured to control output currents from the power module is mounted; and
 a housing including the power module, the input and output board, and the control board,
 wherein the input and output board and the control board are arranged to vertically face each other,
 wherein a discrete part that is taller in height than a half a distance between the input and output board and the control board is mounted only on a surface of the input and output board, the surface facing the control board,
 wherein the housing includes a case and a cover that faces a ceiling of the case and four side walls located between the ceiling and the cover, and at least one of the four side walls is inclined inward,
 wherein the input and output board and the control board are located to face each other with a predetermined space, and
 wherein the power module includes a seal body having a rectangular plane shape in a plane view, plural first leads extending along one side of two opposite sides of the seal body, and plural second leads extending along the other side of the two opposite sides of the seal body, the first leads are connected to the input and output board, the second leads are connected to the control board, and the seal body is inclined along the side wall inclined inward.

2. The electronic control unit according to claim 1, wherein the discrete part is mounted on the face of the input and output board facing the control board, such that a height direction of the discrete part is a vertical direction that is perpendicular to an extending direction of the surface of the input and output board, the surface facing the control board.

3. The electronic control unit according to claim 1, wherein the discrete part is mounted on the face of the input and output board facing the control board, such that a height direction of the discrete part is substantially parallel to an extending direction of the surface of the input and output board, the surface facing the control board.

4. The electronic control unit according to claim 1, wherein an opening into which the discrete part is insertable is formed in the control board.

5. An electric power steering device comprising the electronic control unit according to claim 1.

6. A vehicle comprising the electric power steering device according to claim 5.

7. The electronic control unit according to claim 2, wherein an opening into which the discrete part is insertable is formed in the control board.

8. The electronic control unit according to claim 3, wherein an opening into which the discrete part is insertable is formed in the control board.

9. An electric power steering device comprising the electronic control unit according to claim 2.

10. An electric power steering device comprising the electronic control unit according to claim 3.

11. An electric power steering device comprising the electronic control unit according to claim 4.

\* \* \* \* \*